United States Patent [19]

Degun et al.

[11] Patent Number: 5,650,760

[45] Date of Patent: Jul. 22, 1997

[54] MICROWAVE ENCLOSURE

[75] Inventors: Joginder S. Degun, Torrance; Robert A. Brunner, Redondo Beach, both of Calif.

[73] Assignee: Hughes Aircraft Company, Los Angeles, Calif.

[21] Appl. No.: 555,469

[22] Filed: Nov. 13, 1995

[51] Int. Cl.⁶ .............................. H01P 1/00; H01L 23/10
[52] U.S. Cl. ........................ 333/246; 257/728; 333/247; 333/260
[58] Field of Search .................. 333/246, 247, 333/251, 260; 257/698, 699, 728; 439/63

[56] References Cited

U.S. PATENT DOCUMENTS

| | | | |
|---|---|---|---|
| 4,672,151 | 6/1987 | Yamamura | 257/664 X |
| 4,713,634 | 12/1987 | Yamamura | 333/247 X |
| 4,881,116 | 11/1989 | Hidada et al. | 257/698 X |
| 5,113,161 | 5/1992 | Inami et al. | 333/246 |
| 5,406,120 | 4/1995 | Jones | 257/706 |
| 5,428,327 | 6/1995 | Bahl | 333/246 |
| 5,451,818 | 9/1995 | Chan et al. | 257/728 |

*Primary Examiner*—Paul Gensler
*Attorney, Agent, or Firm*—Terje Gudmestad; Wanda K. Denson-Low

[57] ABSTRACT

Microwave ports and low-frequency ports of a microwave enclosure are configured to realize high return losses and low insertion losses and suppress resonance modes below a predetermined microwave frequency. The microwave ports include microwave transmission lines which have first and second microstrip portions and a stripline portion which connects the first and second microstrip portions. The microwave transmission lines are positioned with the stripline portion received in a housing aperture. The low-frequency ports include a dielectric member and a plurality of metallic signal lines carried within the dielectric member. The dielectric member is relieved to expose inner and outer ends of the signal lines. The connector systems are received in housing apertures with metallic members positioned through the dielectric members and across the connector apertures to electrically partition the connector apertures into subapertures which each have a predetermined microwave cutoff frequency.

5 Claims, 3 Drawing Sheets

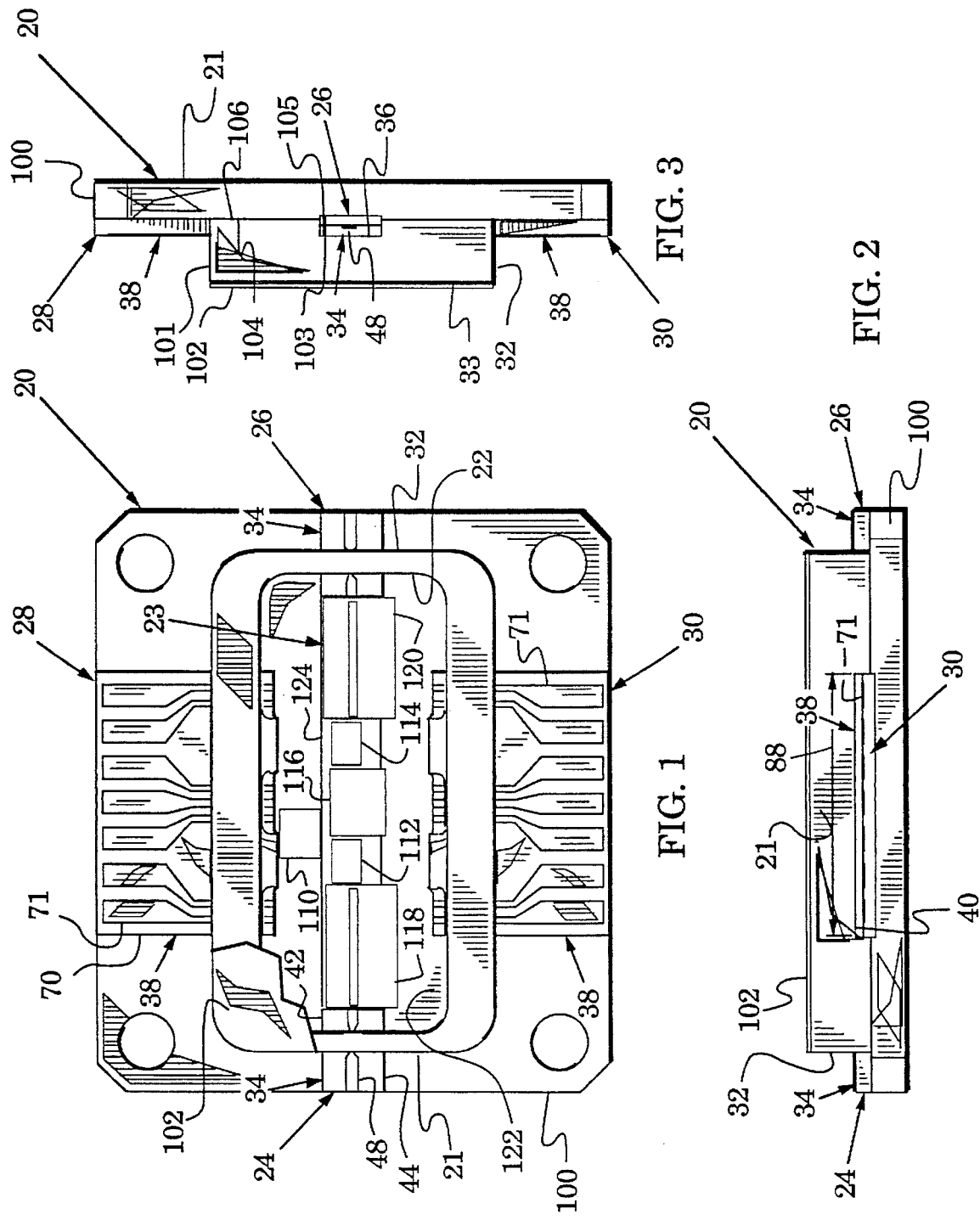

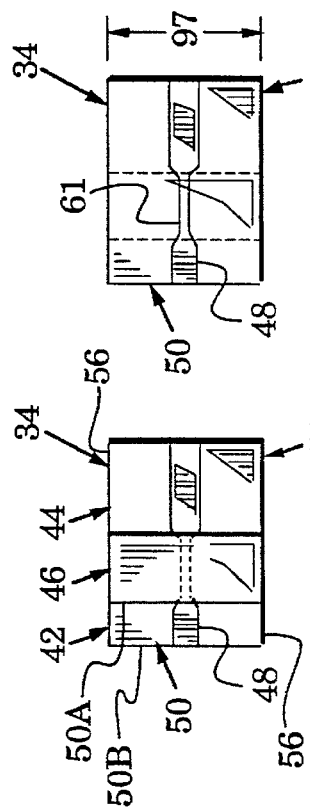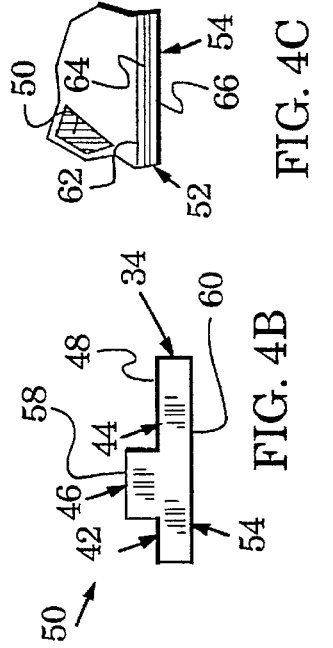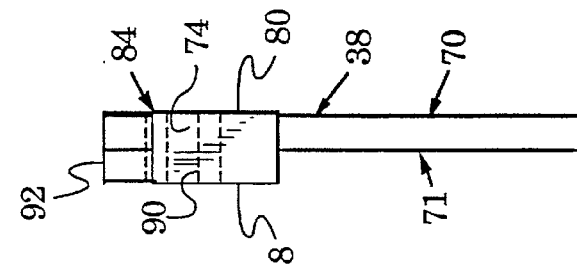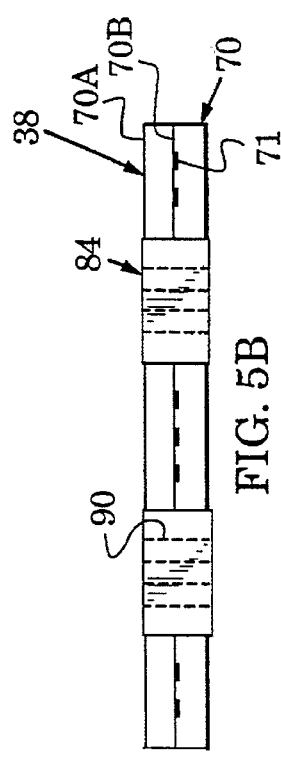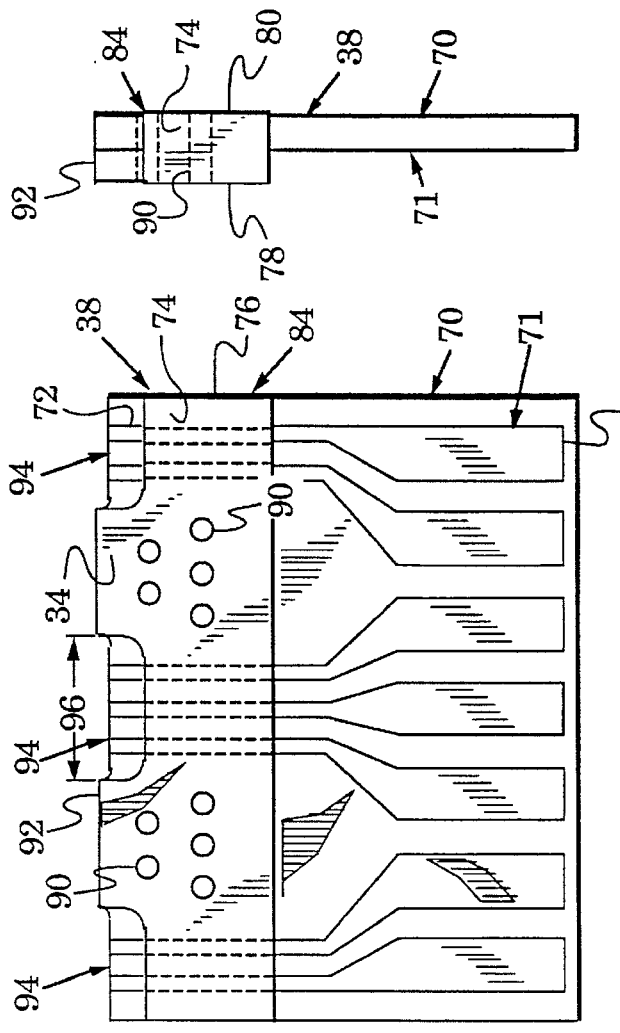

MICROWAVE ENCLOSURE

BACKGROUND OF THE INVENTION

1. Field of the Invention

The present invention relates generally to microwave circuits and more particularly to microwave-circuit enclosures.

2. Description of the Related Art

Size, weight and cost are primary design considerations in microwave-based, electronic systems, e.g., satellite communications and phased-array radars. Accordingly, there is a continuing trend to miniaturization and integration of microwave circuits. Microwave integrated circuits (MICs) are assemblies which typically combine different circuit functions by connecting microwave devices (e.g., planar semiconductor devices and passive distributed or lumped circuit elements) with microwave transmission line structures (e.g., microstrip and stripline). MICs generally comprise two categories, hybrid MICs and monolithic MICs (MMICs).

In hybrid technology, solid state devices and passive circuit elements are carried on a dielectric, e.g., glass or ceramic, substrate. The passive circuits are typically combinations of distributed and lumped elements which are fabricated with thin and thick-film technology. In MMICs, active devices of high-frequency semiconductor systems (e.g., gallium arsenide) are grown on or in a semi-insulating substrate with various deposition processes (e.g., epitaxy, ion implantation, sputtering, evaporation, photolithography and etching) and passive elements are either deposited on the substrate or grown in it.

Although hybrid and monolithic circuits have been realized with excellent performance characteristics across a range of microwave frequencies, e.g., X, Ku and K bands, their performance has often been compromised by the microwave enclosures which shield them from associated microwave circuits. These enclosures have generally included walls and covers which form a hermetically sealed chamber. Microwave signal ports and low-frequency signal ports (e.g., for entry of control signals and DC power) are typically formed with glass encapsulated pins that transit the chamber walls.

In some cases, the pins of the microwave ports terminate on the outer side of the walls in a coaxial connector. However, microwave systems often comprise several MICs and MMICs which are positioned in close proximity. In this case, the system size is reduced by terminating the pins at each end in flat tabs which spatially correspond with the signal line of microstrip transmission lines. To allow for thermal expansion, the tabs are connected on each side of the enclosure walls to microstrip signal lines with metallic ribbons. In the wall transition region, the microwave pin is usually cylindrical and is spaced from a cylindrical bore by an annular glass seal. In the wall transition region, therefore, the pin and the wall bore form a microwave coaxial transmission line.

However, on each side of this coaxial line, the tab and attached ribbon are typically suspended in air and they form a transmission structure whose transmission parameters (e.g., phase constant, attenuation constant and characteristic impedance) are either unknown or poorly defined. Thus, a low return loss, e.g., ~10 db, is typically realized with these conventional microwave ports (return loss is a function of incident power to reflected power). In addition, an impedance-matching network is often required between the microwave pin and the internal microwave circuits. These impedance-matching networks are time consuming to design, install and tune.

Functionally, the glass encapsulated pins act as microwave antennas and cause the enclosure's chamber to operate as a waveguide which can support a plurality of waveguide modes. This uncontrolled waveguide structure often causes instabilities in the enclosure's microwave circuits. These instabilities may be suppressed with filter networks which are positioned between stages of the microwave circuit but these networks increases the size, weight and cost of the microwave enclosure.

Conduction paths through the glass encapsulated pins are usually completed with metallic ribbons which are installed with conventional equipment, e.g., gap welders. The cost of this process is increased because support must be provided to the pins to prevent breakage of their glass seals.

Microwave enclosures with glass encapsulated pins are exemplified by part numbers 4947096-1 and 2 of Hughes Aircraft Company, the assignee of the present invention, which are manufactured by Balo Precision Parts of Butler, N.J.

SUMMARY OF THE INVENTION

The present invention is directed to hermetically sealed microwave enclosures with microwave ports that realize high return losses, e.g., ~18 db, and low insertion losses and low-frequency ports that suppress resonance modes below a predetermined microwave frequency, e.g., 25 GHz.

These goals are accomplished with the realization that the structure of such ports must substantially form microwave transmission lines so as to reduce transmission discontinuities and to establish desired microwave cutoff frequencies.

The microwave ports each include a microwave aperture in a housing and a microwave transmission line which has first and second microstrip portions and a stripline portion which connects the first and second microstrip portions. The microwave transmission line is positioned with its stripline portion received in the housing aperture.

The low-frequency ports each include a connector aperture in a housing and a connector system which has a dielectric member and a plurality of metallic signal lines carried within the dielectric member. The dielectric member is relieved to expose inner and outer ends of the signal lines. The connector system is received in the connector aperture. The connector system includes metallic members that are positioned through the dielectric member and across the connector aperture to electrically partition the connector aperture into subapertures which each have a predetermined microwave cutoff frequency.

In one embodiment, the microwave transmission lines each include a metallic signal line and a dielectric member which surrounds the signal line and is configured to partially expose the signal line ends in the first and second microstrip portions.

In contrast to conventional glass-encapsulated pins, the signal lines of the microwave transmission lines and the connector systems are resistant to damage when interconnections, e.g., metallic ribbons, are attached to them because they are supported by their respective dielectric members.

The novel features of the invention are set forth with particularity in the appended claims. The invention will be best understood from the following description when read in conjunction with the accompanying drawings.

BRIEF DESCRIPTION OF THE DRAWINGS

FIG. 1 is a plan view of a microwave enclosure embodiment in accordance with the present invention;

FIG. 2 is a front elevation view of the microwave enclosure of FIG. 1;

FIG. 3 is a side elevation view of the microwave enclosure of FIG. 1;

FIG. 4A is a plan view of a microwave transmission line in the microwave enclosure of FIG. 1;

FIG. 4B is a front elevation view of the microwave transmission line of FIG. 4A;

FIG. 4C is an enlarged, cross-sectional view of a hermetic liner in the microwave transmission line of FIGS. 4A and 4B;

FIG. 4D is a view similar to FIG. 4A with a portion of a dielectric member removed to expose a microwave signal line;

FIG. 5A is a plan view of a connector system in the microwave enclosure of FIG. 1;

FIG. 5B is a rear elevation view of the connector system of FIG. 5A;

FIG. 5C is a side elevation view of the connector system of FIG. 5A, and

DETAILED DESCRIPTION OF THE PREFERRED EMBODIMENTS

Figure 6:
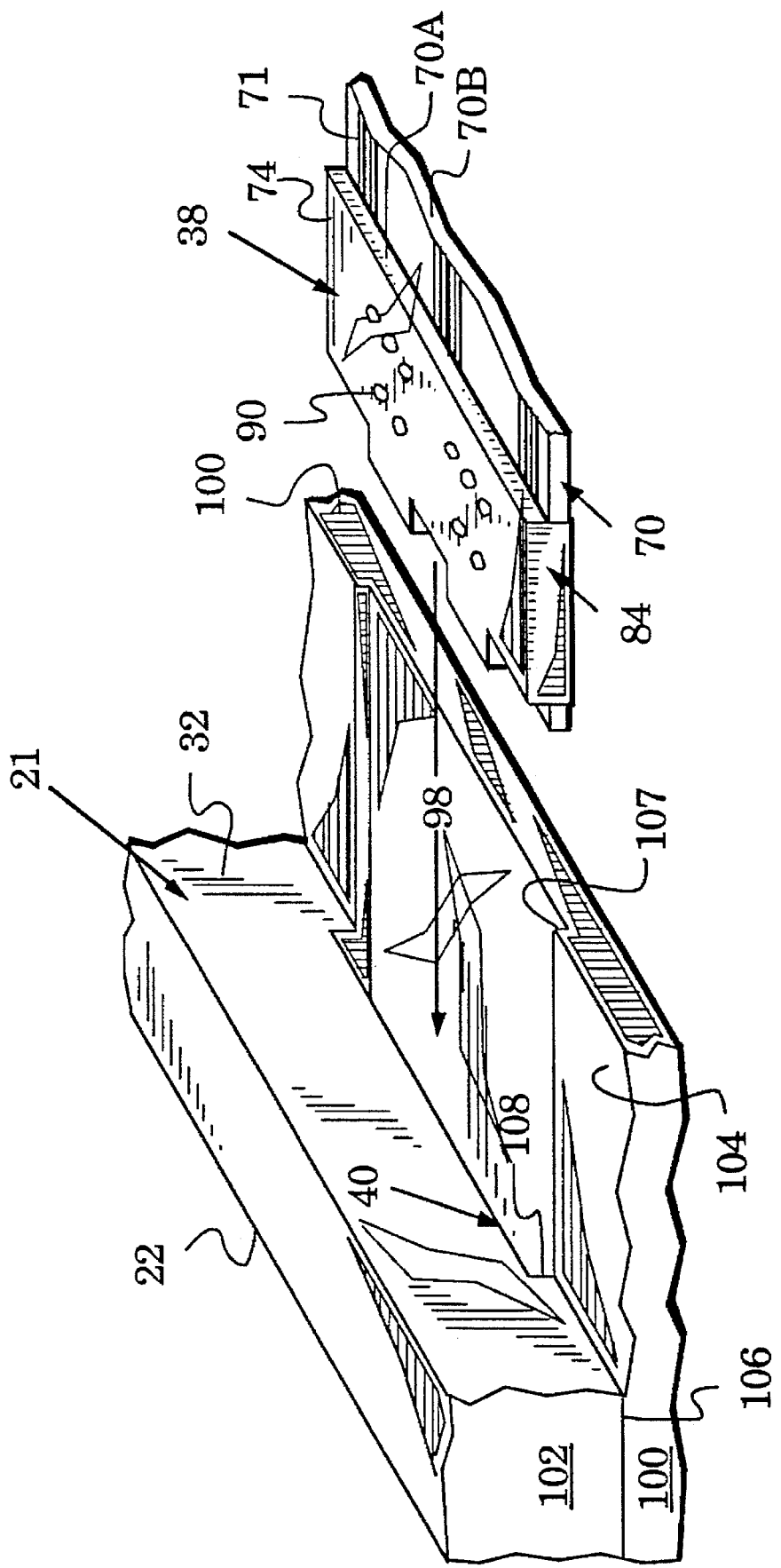
FIG. 6 is a perspective view which illustrates the insertion of a connector system in a connector aperture in the enclosure of FIG. 1.

FIGS. 1–3 illustrate a microwave enclosure 20 which has a housing 21 that forms a chamber 22 for receiving microwave circuits 23. The enclosure 20 provides microwave access to the circuits 23 in the form of microwave ports that can realize high return losses and low insertion losses. The enclosure 20 also provides low-frequency access ports to the circuits 23, which are configured to suppress spurious electromagnetic radiation modes that could excite instabilities in the microwave circuits 23.

In particular, the enclosure 20 has microwave ports 24 and 26 and low-frequency connector ports 28 and 30. These ports are arranged to communicate with the circuits 23 through a housing wall 32 which adjoins the chamber 22. Each of the microwave ports 24 and 26 includes a microwave transmission line 34 which is received into a microwave aperture 36. The microwave apertures 36 penetrate the wall 32 and communicate with the chamber 22. Each of the low-frequency ports 28 and 30 include a connector system 38 which is received into a connector aperture 40. The connector apertures 40 also penetrate the wall 32 and communicate with the chamber 22.

The microwave transmission line 34 is shown in detail in FIGS. 4A–4D. The transmission line 34 includes inner and outer microstrip portions 42 and 44 and a stripline portion 46 which connects the inner and outer microstrip portions. These transmission line portions 42, 44 and 46 are formed with a metallic signal line 48 which is surrounded by a dielectric member 50. The dielectric member 50 is relieved at each end to partially expose the signal line 48 and form the inner and outer microstrip portions 42 and 44. Preferably, the signal line 48 has the typical rectangular cross section of microstrip and stripline signal lines.

A microwave ground plane for the transmission line 34 is formed as part of a metallic liner which covers the sides 56, the top 58 and bottom 60 of the dielectric member 50. The signal line 48 of the transmission line 34 is clearly shown in FIG. 4D, in which an upper part of the dielectric member 50 is removed for clarity of illustration. The signal line 48 and its ground plane are configured to have a characteristic impedance, e.g., 50 ohms, which is compatible with the microwave circuits (23 in FIG. 1) in the enclosure chamber (22 in FIG. 1). Because the transmission line dimensions (e.g., signal line to ground plane spacing) are chosen in accordance with this characteristic impedance, the width of a stripline portion 61 of the signal line 48 may differ from the width of the signal line in the inner and outer microstrip portions 42 and 44 of FIGS. 4A and 4B.

The dielectric member 50 is preferably made from a microwave-grade ceramic, e.g., alumina. As illustrated in the enlarged cross section of FIG. 4C, the liner 54 includes a refractory metal layer 62 which is between the ground plane 52 and the dielectric member 50 (refractory metals are generally those metals which have extremely high melting points). In an exemplary liner 54, the layer 62 is a refractory metal which has good adhesion to ceramics, e.g., tungsten. The ground plane layer 52 includes a sublayer 64 of a metal which has good adhesion qualities to refractory metals, e.g., nickel, and an upper sublayer 66 of a metal which has low microwave signal resistivity and good corrosion resistance, e.g., gold. The microwave signal line 48 preferably has the same cross-sectional structure as the liner 54 of FIG. 4C.

The ground plane of the stripline portion 46 is particularly formed by the parts of the ground plane layer 52 which are on the top 58 and bottom 60 of the dielectric member 50. The ground planes of the microstrip portions 42 and 44 are particularly formed by the part of the ground plane layer 52 which is on the bottom 60 of the dielectric member 50.

Each microwave transmission line 34 is inserted into the housing 21 of FIGS. 1–3 with its stripline portion 46 received in one of the microwave apertures 36, its inner microstrip portion 42 within the chamber 21 and its outer microstrip portion 46 exterior to the housing 21. This insertion positions the liner 54 between the housing 21 and the dielectric member 50.

The connector system 38 is shown in detail in FIGS. 5A–5C. The connector system 38 includes a dielectric member 70 and a plurality of metallic signal lines 71 which are carried within the dielectric member. Each of the signal lines 71 has an inner end 72 and an outer end 73. The dielectric member 70 is relieved on each side of a central portion 74 to partially expose the inner and outer signal line ends 72 and 73. To cause the inner and outer ends 72 and 73 to be easily accessible and to reduce the height of the connector aperture (40 in FIG. 2), the signal lines 71 are preferably positioned in a spaced, coplanar arrangement. Also, the signal lines 71 preferably have the same rectangular cross section which is typical of microwave stripline and microstrip signal lines.

Similar to the dielectric member 50 of the microwave transmission line 34, the dielectric member 70 is preferably made from a microwave-grade ceramic, e.g., alumina. The sides 76, top 78 and bottom 80 of the dielectric member 70 are covered with a liner 84 which is similar to the liner 54 of FIG. 4C.

Each connector system 38 is inserted into the housing 21 of FIGS. 1–3 with its central portion 74 received in one of the connector apertures 40, its signal line inner ends 72 within the chamber 21 and its outer signal line ends 73 exterior to the housing 21. This insertion positions the liner 84 between the housing 21 and the dielectric member 70.

At microwave frequencies, each connector aperture (40 in FIG. 2) essentially appears to be a waveguide which could support microwave propagation through the wall 32. Considered as a waveguide, the connector aperture 40 has a microwave cutoff frequency of $$f_c = \frac{c}{2a\sqrt{\epsilon_o \epsilon_r}} \quad (1)$$

in which c is the speed of light in air, $\epsilon_o$ is the permittivity of air, $\epsilon_r$ is the relative permittivity of the dielectric member 70 and a is the aperture width 88 shown in FIG. 2. This waveguide structure enhances the generation of various waveguide radiation modes for frequencies greater than the microwave cutoff frequency. Because many microwave circuits contain high-gain elements, these waveguide modes may cause circuit instabilities in the microwave circuits 23.

In a feature of the invention, metallic members in the form of waveguide posts 90 are positioned through the dielectric member 70 as shown in FIGS. 5A–5C. These metallic members electrically contact the liner 84 on the top 78 and bottom 80 of the dielectric member 70. Although the posts 90 can be of various shapes and formed of any conductive metal, they are easily realized as holes which are filled with the same refractory metal that is in the liner 84, i.e., the refractory layer 62 of FIG. 4C. As illustrated in FIGS. 5A–5C, a plurality of closely-spaced posts 90 can be used to effect the partitioning and they can be supplemented by carrying the liner 84 over the front surface 92 of the dielectric member 70.

When the connector systems 38 are inserted into the connector apertures (40 in FIG. 2), the posts 90 effectively partition each connector aperture 40 into subapertures 94 which have a width, e.g., the width 96 in FIG. 5A, that is less than the aperture width 88. Thus, the connector system 38 can be configured to realize a predetermined microwave cutoff frequency. Radiation propagation and modes below that predetermined frequency will be suppressed. This suppression enhances the stability of the microwave circuits 23.

To accommodate the posts 90, the signal lines 71 are routed along paths which pass through the subapertures 94. For example, the connector system 38 of FIGS. 5A–5C has seven signal lines 71 which are routed so as to permit the installation of two sets of posts 90 between the top and bottom of the liner 84. If the dimension 96 is ~1.8 millimeters and the dielectric member 70 is alumina for which the relative permittivity is ~9.2, then equation 1 indicates that the cutoff frequency of the subapertures 94 is ~25 GHz. With this connector system in the enclosure 20 of FIGS. 1–3, waveguide modes in the connector apertures 40 will be suppressed for frequencies below 25 GHz. This will enhance the stability of the microwave circuits 23 in the regions below this cutoff frequency. In this example, the width 97 of the microwave transmission line 34 (see FIG. 4D) is preferably ~1.8 millimeters to give the microwave ports 24 and 26 a corresponding cutoff frequency of ~25 GHz.

The insertion of one of the connector systems 38 is illustrated in FIG. 6 in which like elements of FIGS. 1–3 and 5A–5C are indicated with like reference numbers. The connector system 38 moves as indicated by the movement arrow 98 until the central portion 74 is received in the connector aperture 40 with the liner 84 between the dielectric member 70 and the housing 21. The housing 21 and the connector system 38 are only partially shown in FIG. 6.

In an exemplary assembly process, the dielectric member 50 of the microwave transmission line 34 is prepared from green (unfired) alumina and a refractory layer 62 of tungsten is applied with a suitable process (e.g., silkscreening) to define the regions of the liner 54 and signal line 48. The tungsten and alumina are then fired in a kiln at a suitable temperature, e.g., ~1500° C. The sublayers 64 and 66 of the ground plane layer 52 are then deposited over the refractory metal layer 62.

The completed microwave transmission lines are then inserted into the microwave apertures 36 of the housing 21 with the stripline portions 46 received in the microwave apertures 36. The liner 54 is brazed to the housing 21 with a suitable filler metal, e.g., an alloy of copper and silver, at a suitable temperature, e.g., ~800° C., to form a hermetic seal between the microwave transmission line 34 and the housing 21. The connector systems 38 are prepared, fired and installed into the housing 21 with similar assembly processes.

In an exemplary fabrication process, the materials of the housing 21 and the dielectric members 50 and 70 are selected to have temperature coefficients of expansion that are closely matched to that of the semiconductor system of the microwave circuits 23. For example, many microwave circuits are formed from the compound gallium arsenide semiconductor system. Accordingly, the housing 21 is preferably formed of materials (e.g., Kovar, a copper-molybdenum alloy or a copper-tungsten alloy) whose temperature coefficient of expansion is close to that of gallium arsenide. A coating of a material, e.g., gold, which has a low microwave resistivity is preferably deposited over the housing 21 with an undercoat of a material, e.g., nickel, which has good adhesion qualities. Similarly, the dielectric members 50 and 70 are preferably formed of materials (e.g., alumina) whose temperature coefficient approxiamtes that of gallium arsenide.

In another exemplary fabrication process, the dielectric members 50 and 70 can be fabricated by forming two substrates, depositing the signal lines on one of the substrates and then joining the substrates together. For example, the dielectric member 50 of FIGS. 4A–4D may include two substrates 50A and 50B as shown in FIG. 4A and the dielectric member 70 of FIGS. 5A–5C may include two substrates 70A and 70B as shown in FIGS. 5B and 6.

The housing 21 can be assembled from a flat base 100, a ring 101 and a cover 102. As shown in FIGS. 1–3, one surface of the ring 101 abuts the base 100 and the ring 101 rises from the base 100 to form the wall 32. The cover 102 is positioned across an opposite surface of the ring 101. In this embodiment, the chamber 22 is formed as the space which is within the ring 101 and between the base 100 and the cover 102. In an exemplary housing 21, the dimensions of the chamber 23 are approximately 6 by 15 millimeters with a depth of 1.5 millimeters. Equation (1) yields a cutoff frequency of 25 GHz.

Although the microwave apertures 36 and connector apertures 40 can be simple apertures through the ring 101, they are each preferably formed with matching recesses in the base 100 and the ring 101. For example, each microwave aperture 36 consists of a recess 103 in the surface 104 of the base 100 and a recess 105 in the surface 106 of the ring 101 as shown in FIG. 3. In a similar manner, each connector aperture 40 consists of a recess 107 in the surface 104 of the base 100 and a recess 108 in the surface 106 of the ring 101 as shown in FIG. 6. When the ring surface 106 abuts the base surface 104, the recesses 103 and 104 align and form the aperture 36 and the recesses 107 and 108 align and form the aperture 40.

This structure facilitates alignment of the microwave transmission lines 34 and connector systems 38. After the microwave transmission lines 34 and connector systems 38 are placed in their respective recesses in the base 100, the ring 101 is positioned over the base 100 with the ring's recesses receiving the microwave transmission lines 34 and connector systems 38. The assembled base 100, ring 101, microwave transmission lines 34 and connector systems 38 can then be brazed together.

The microwave circuits 23 of FIG. 1 typically include open-chip active elements, passive components (e.g., the capacitor 110) and MMIC's (e.g., the amplifiers 112 and 114 and step attenuator 116). If the microwave circuits do not fill the chamber 22, they may be connected to the microwave ports 24 and 26 with microstrip transmission lines (e.g., the lines 118 and 120).

The floor 122 of the housing 21 is positioned to place the elements of the microwave circuits 23, the microstrip portions 42 of the microstrip transmission lines 34 and the signal lines 71 of the connector systems 38 in a coplanar arrangement. This facilitates their interconnection with metallic ribbons (for clarity of illustration, the ribbons are not shown). Because MMICs are typically quite thin, e.g., ~0.1 millimeter, a ridge 124 may be extended upward from the housing floor 122 to bring them into the coplanar relationship.

The microwave circuits are attached to the floor 122 and/or the ridge 124 with a suitable filler metal, e.g., a gold-tin alloy, at a suitable temperature, e.g., ~290° C. After the circuit interconnections have been completed, the cover 102 is seam sealed to complete the hermetically sealed chamber 22.

The microwave ports of the invention realize high return losses, e.g., ~18 db, and low insertion losses, and the low-frequency ports suppress resonances below a subaperture microwave cutoff frequency, e.g., 25 GHz. In contrast to conventional glass-encapsulated pins, the signal lines (48 and 71) are resistant to damage when interconnections, e.g., metallic ribbons, are attached to them because they are supported by their respective dielectric members (50 and 70).

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A microwave enclosure for enclosing a microwave circuit which has an operational frequency $f_{op}$, comprising:

a housing forming a chamber to receive said microwave circuit and having a wall adjoining said chamber;

a microwave port which includes:

a) a microwave aperture formed through said wall;
   b) a metallic microwave line received through said microwave aperture; and
   c) a microwave dielectric member configured and positioned to space said microwave line from said wall and to seal said microwave aperture; said microwave line and said microwave aperture forming a stripline transmission line which communicates with said chamber to facilitate microwave communication with said microwave circuit;

and;

a signal port which includes:

a) a signal aperture formed through said wall;
   b) a plurality of metallic coplanar signal lines received through said signal aperture;
   c) a signal dielectric member configured and positioned to space said signal lines from said wall and to seal said signal aperture; and
   d) a metallic liner between said signal dielectric member and said wall which is extended across said signal aperture to divide it into subapertures;

wherein said coplanar signal lines are arranged to communicate with said chamber through said subapertures to facilitate signal communication with said microwave circuit;

said subapertures having microwave cutoff frequencies greater than said operational frequency $f_{op}$.

2. The microwave enclosure of claim 1, wherein said microwave dielectric member and said signal dielectric member each comprise alumina.

3. The microwave enclosure of claim 1, wherein said liner includes a nickel layer positioned between a tungsten layer and a gold layer and said tungsten layer adjoins said signal dielectric member.

4. The microwave enclosure of claim 1, further including a microwave metallic liner carried over said microwave dielectric member wherein said microwave liner includes a nickel layer positioned between a tungsten layer and a gold layer and said tungsten layer adjoins said microwave dielectric member.

5. The microwave enclosure of claim 1, further including a plurality of metallic posts arranged across said signal dielectric member and positioned between said subapertures.

* * * * *